(12) United States Patent
Park

(10) Patent No.: US 10,516,389 B2
(45) Date of Patent: Dec. 24, 2019

(54) INTERFACE CIRCUIT AND INTERFACE DEVICE

(71) Applicant: SAMSUNG ELECTRONICS CO., LTD., Suwon-si (KR)

(72) Inventor: Jong Min Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/029,764

(22) Filed: Jul. 9, 2018

(65) Prior Publication Data

US 2019/0140627 A1  May 9, 2019

(30) Foreign Application Priority Data

Nov. 3, 2017 (KR) .................. 10-2017-0146058
Dec. 21, 2017 (KR) .................. 10-2017-0177159
Apr. 9, 2018 (KR) .................. 10-2018-0041027

(51) Int. Cl.
| | |
|---|---|
| *H03K 5/00* | (2006.01) |
| *H03K 5/04* | (2006.01) |
| *G11C 7/10* | (2006.01) |
| *G06F 15/17* | (2006.01) |
| *G09G 3/20* | (2006.01) |
| *H04N 5/38* | (2006.01) |
| *G09G 5/00* | (2006.01) |

(52) U.S. Cl.
CPC ............ *H03K 5/04* (2013.01); *G06F 15/17* (2013.01); *G09G 3/2096* (2013.01); *G11C 7/10* (2013.01); *G11C 7/1057* (2013.01); *G11C 7/1069* (2013.01); *G09G 5/006* (2013.01); *G09G 2300/0426* (2013.01); *G09G 2310/08* (2013.01); *H04N 5/38* (2013.01)

(58) Field of Classification Search
CPC ... H03K 5/04; G11C 7/10; H04N 5/38; G09G 5/006
USPC .................................................. 327/112, 333
See application file for complete search history.

(56) References Cited

U.S. PATENT DOCUMENTS 4,622,482 A * 11/1986 Ganger ................ H03K 17/163
327/410
5,023,472 A  6/1991 Hashimoto et al.
(Continued)

FOREIGN PATENT DOCUMENTS

KR  101243814 B1  3/2013

*Primary Examiner* — Ryan Jager
(74) *Attorney, Agent, or Firm* — Sughrue Mion, PLLC

(57) ABSTRACT

An interface circuit is provided and includes a first switching device connected to a first power supply node supplying a first voltage, and controlled by a first input signal, a second switching device connected to a second power supply node supplying a second voltage lower than the first voltage, and controlled by a second input signal different from the first input signal, an output node through which the first switching device and the second switching device are connected to each other in series, outputting an output signal, a first resistor connected between the first power supply node and the first switching device, a second resistor connected between the second power supply node and the second switching device, a first capacitor connected to a node between the first resistor and the first switching device, and a second capacitor connected to a node between the second resistor and the second switching device.

18 Claims, 16 Drawing Sheets

(56) References Cited

U.S. PATENT DOCUMENTS

| | | | | |
|---|---|---|---|---|
| 6,087,885 | A * | 7/2000 | Tobita | H03K 19/00369 |
| | | | | 327/379 |
| 6,222,751 | B1 * | 4/2001 | Portaluri | H02M 7/53803 |
| | | | | 318/400.39 |
| 6,281,715 | B1 * | 8/2001 | DeClue | H03K 19/01852 |
| | | | | 327/108 |
| 6,812,734 | B1 * | 11/2004 | Shumarayev | H04L 25/0278 |
| | | | | 326/26 |
| 7,301,364 | B2 | 11/2007 | Uenishi | |
| 7,924,066 | B2 | 4/2011 | Gagne et al. | |
| 8,779,805 | B1 | 7/2014 | Fernandez et al. | |
| 9,473,127 | B1 * | 10/2016 | Azin | H03K 19/00361 |
| 2002/0079923 | A1 | 6/2002 | Tinsley et al. | |
| 2005/0162191 | A1 * | 7/2005 | Vorenkamp | H03K 19/00361 |
| | | | | 326/88 |
| 2006/0217079 | A1 | 9/2006 | Yu et al. | |
| 2008/0218292 | A1 | 9/2008 | Park et al. | |
| 2008/0246512 | A1 * | 10/2008 | Seth | H03K 19/01721 |
| | | | | 326/83 |
| 2009/0075607 | A1 | 3/2009 | Khoury | |
| 2009/0146682 | A1 * | 6/2009 | Lee | H03K 5/04 |
| | | | | 326/27 |
| 2013/0113524 | A1 * | 5/2013 | Rueger | H03F 3/2171 |
| | | | | 327/109 |
| 2015/0171859 | A1 * | 6/2015 | Pisau | H03K 17/302 |
| | | | | 327/379 |

* cited by examiner

INTERFACE CIRCUIT AND INTERFACE DEVICE

CROSS-REFERENCE TO RELATED APPLICATION(S)

This application claims priority from Korean Patent Application Nos. 10-2017-0146058, 10-2017-0177159 and 10-2018-0041027 filed on Nov. 3, 2017, Dec. 21, 2017 and Apr. 9, 2018, respectively, in the Korean Intellectual Property Office, the disclosures of each of which are incorporated by reference herein in their entirety.

BACKGROUND

1. Field

The present inventive concept relates to an interface circuit and an interface device.

2. Description of Related Art

A plurality of integrated circuit chips included in electronic devices may exchange data with each other via interface circuits. As the capacity of data processed by electronic devices gradually increases, interface circuits capable of providing high-speed data communications have been proposed. In addition, as the amount of integrated circuit chips included in electronic devices has increased and the types thereof have become varied, various methods to reduce the affect of data transmission and reception operations via interface circuits on other integrated circuit chips have been proposed.

SUMMARY

It is an aspect to provide an interface circuit in which data may be transmitted at a relatively high speed by adjusting a slew rate of an output signal, and in which electromagnetic interference (EMI) affecting other peripheral integrated circuit chips, depending on an operational environment, may be significantly reduced, and a method of operating the same.

According to an aspect of an example embodiment, an interface circuit includes a first switching device connected to a first power supply node supplying a first power supply voltage, and controlled by a first input signal, a second switching device connected to a second power supply node, supplying a second power supply voltage that is lower than the first power supply voltage, and controlled by a second input signal different from the first input signal, an output node defined by a node through which the first switching device and the second switching device are connected to each other in series, and outputting an output signal, a first resistor connected between the first power supply node and the first switching device, a second resistor connected between the second power supply node and the second switching device, a first capacitor connected to a node between the first resistor and the first switching device, and a second capacitor connected to a node between the second resistor and the second switching device.

According to another aspect of an example embodiment, an interface device includes a plurality of interface circuits, each including a first switching device and a second switching device connected in series, a first capacitor connected to a first input terminal of the first switching device, and a second capacitor connected to a second input terminal of the second switching device; and a controller controlling on/off operations of the first switching device and the second switching device of each of the plurality of interface circuits to determine an output signal of each of the plurality of interface circuits, and controlling charging and discharging the first capacitor and the second capacitor of each of the plurality of interface circuits to adjust a slew rate of the output signal of each of the plurality of interface circuits.

According to another aspect of an example embodiment, an interface circuit includes a first switching device receiving a first power supply voltage, on/off operations of the first switching device being controlled by a first input signal, a second switching device receiving a second power supply voltage that is lower than the first power supply voltage, on/off operations of the second switching device being controlled by a second input signal, a first capacitor connected to a first input node of the first switching device, and charged when the first switching device is turned on, and a second capacitor connected to a second input node of the second switching device, and discharged when the second switching device is turned off.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

Figure 1:
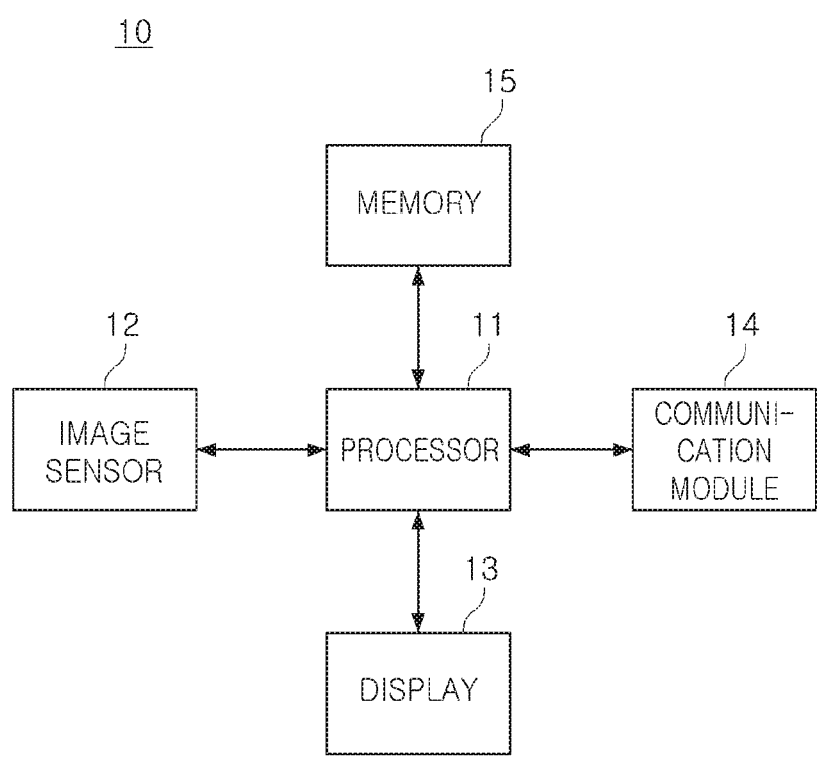
FIG. 1 is a schematic block diagram of an electronic device according to an example embodiment.

Referring to FIG. 1, an electronic device 10 according to an example embodiment may include a processor 11, an image sensor 12, a display 13, a communication module 14, a memory 15, and the like. The processor 11 may be implemented by an integrated circuit such as an application processor, a central processing unit (CPU), or the like.

The processor 11, the image sensor 12, the display 13, the communications module 14, the memory 15 and the like may include an interface circuit through which data may be exchanged. The interface circuit may include at least one of a transmission circuit that transmits data and a reception circuit that receives data. For example, when the electronic device 10 is a mobile device, the processor 11 and the image sensor 12 may include an interface circuit transmitting and receiving data according to a Mobile Industry Processor Interface (MIPI) standard, and similarly the processor 11 and the display 13 may include an interface circuit transmitting and receiving data according to the Mobile Industry Processor Interface (MIPI) standard.

According to the MIPI standard, a plurality of communication standards having different physical layers may be defined. Thus, the communication standards applied to data communications between various ones of the components 11 to 15 included in the electronic device 10 may be different from each other, and the need for an interface circuit capable of supporting two or more communication standards is increasing.

For example, the interface circuit may support communications based on at least one of a D-PHY interface and a C-PHY interface regulated by the MIPI standard. In the case of communications according to the D-PHY interface, an interface circuit on a transmitting side may separately transmit a signal including data to be transmitted, and a clock signal, and an interface circuit of a receiving side may process a signal received in a differential signaling manner to restore data. On the other hand, in the case of communications according to the C-PHY interface, interface circuits of the transmitting side and the receiving side may exchange signals using a multilevel signaling method. In an example embodiment, in the case of communications according to the C-PHY interface, a clock signal may be omitted and not be separately transmitted.

Since the capacity of data exchanged between the components 11 to 15 included in the electronic device 10 is gradually increasing, research into an interface circuit capable of exchanging data at a relatively high speed has been actively undertaken. Further, studies with the goal of data transmission and reception operations by at least portions of the components 11 to 15 via an interface circuit not interfering with operations of other components 11 to 15, are also being actively conducted.

Figure 2A:
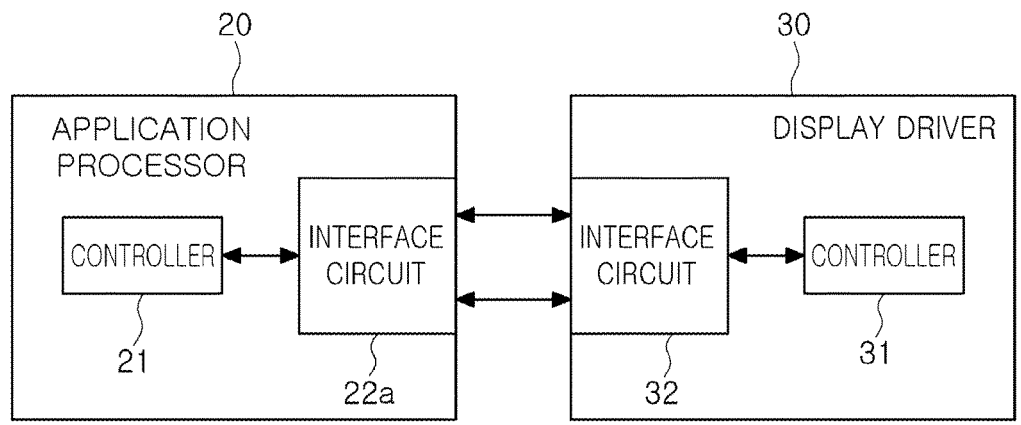
FIGS. 2A and 2B are schematic block diagrams of an interface device according to an example embodiment.
Figure 2B:
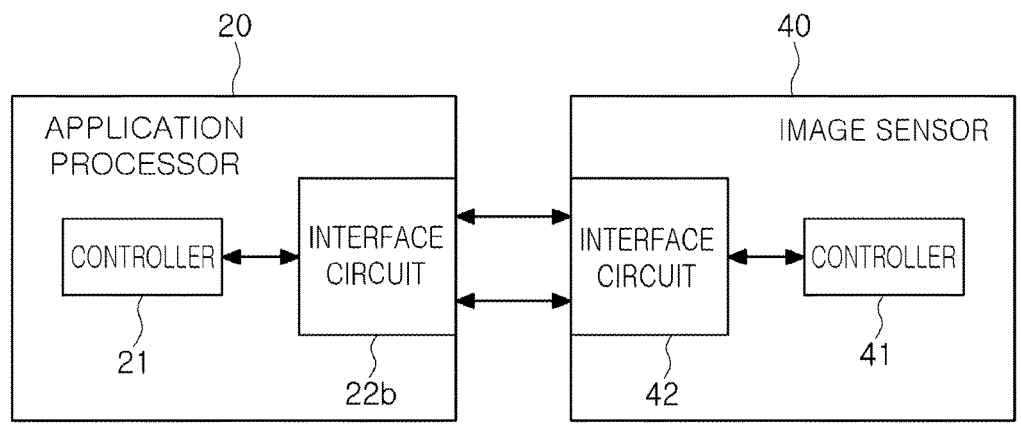

FIGS. 2A and 2B are schematic block diagrams of an interface device according to an example embodiment.

Referring to FIG. 2A, an application processor 20 may include a controller 21 and an interface circuit 22a. In an example embodiment, the controller 21 may include a control logic controlling an overall operation of the application processor 20. The interface circuit 22a may be a circuit performing a function of exchanging data with a display driver 30, and an operation method of the interface circuit 22a may be determined by the controller 21.

The display driver 30 may include a controller 31 and an interface circuit 32. The interface circuit 32 of the display driver 30 may exchange data with the interface circuit 22a of the application processor 20 according to a protocol. The protocol may be predetermined. For example, the interface circuit 22a of the application processor 20 and the interface circuit 32 of the display driver 30 may exchange data according to a protocol defined by the MIPI standard. Each of the interface circuits 22a and 32 may include a transmission circuit and a reception circuit.

Referring to FIG. 2B, the application processor 20 may exchange data with an image sensor 40, and the image sensor 40 may include an interface circuit 42 transmitting and receiving data, and a controller 41. The controller 41 may transmit image data generated by the image sensor 40 to the application processor 20 via the interface circuit 42 and an interface circuit 22b of the application processor 20. In some example embodiments, the interface circuit 22b may be the same as the interface circuit 22a and/or may use the same protocol. In other example embodiments, the interface circuit 22b may be different than the interface circuit 22a and/or may use a different protocol from one another.

At least one of the interface circuits 22a, 22b, 32 and 42 according to the example embodiment may have a function of adjusting a slew rate of an output signal. A slew rate of an output signal may be determined by a control signal input to the interface circuits 22a, 22b, 32 and 42 by the controllers 21, 31 and 41. In an example embodiment, the controllers 21, 31 and 41 may charge or discharge capacitors included in the interface circuits 22a, 22b, 32 and 42 by using the control signal input to the interface circuits 22a, 22b, 32 and 42 to adjust the slew rate of the output signal.

Figure 3:
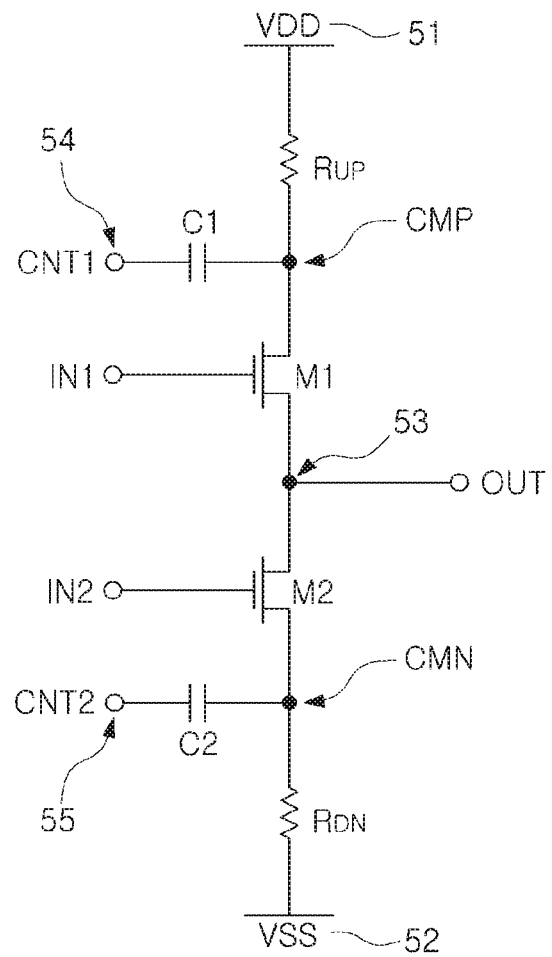
FIG. 3 is a schematic circuit diagram of an interface circuit according to an example embodiment.

FIG. 3 is a schematic circuit diagram of an interface circuit according to an example embodiment.

Referring to FIG. 3, an interface circuit 50 according to an example embodiment may include a first switching device M1, a second switching device M2, a first capacitor C1, a second capacitor C2, and the like. The first switching device M1 and the second switching device M2 may be connected in series between a first power supply node 51 and a second power supply node 52, and an output node 53 may be defined between the first switching device M1 and the second switching device M2. An output signal OUT output to the output node 53 may be determined by a first input signal IN1 controlling the first switching device M1 and a second input signal IN2 controlling the second switching device M2.

The first switching device M1 may be connected to the first power supply node 51 via a first resistor $R_{UP}$, and the second switching device M2 may be connected to the second power supply node 52 via a second resistor $R_{DN}$. A first power supply voltage VDD may be supplied through the first power supply node 51, and a second power supply voltage VSS may be supplied through the second power supply node 52. In an example embodiment, the first power supply voltage VDD may be greater than the second power supply voltage VSS.

The first capacitor C1 may be connected between a first control node 54 to which a first control signal CNT1 is input, and a first common node CMP. The first common node CMP may be defined as a node between the first resistor $R_{UP}$ and the first switching device M1. The second capacitor C2 may be connected between a second control node 55 to which a second control signal CNT2 is input, and a second common node CMN. The second common node CMN may be defined as a node between the second resistor $R_{DN}$ and the second switching device M2.

In an example embodiment, each of the first capacitor C1 and the second capacitor C2 may be an active capacitor, and be implemented as a MOS capacitor. When each of the first capacitor C1 and the second capacitor C2 is the MOS capacitor, the first control signal CNT1 and the second control signal CNT2 may be input to a gate terminal of the first capacitor C1 and a gate terminal of the second capacitor C2, respectively. Also, a source terminal and a drain terminal of the first capacitor C1 may be connected to the first common node CMP, and a source terminal and a drain terminal of the second capacitor C2 may be connected to the second common node CMN. A magnitude of the first capacitor C1 and a magnitude of the second capacitor C2 may be variously determined, and in some example embodiments, the magnitude of the second capacitor C2 may be greater than the magnitude of the first capacitor C1.

For example, when the interface circuit 50 operates according to the D-PHY interface, in which data is transmitted in a differential signaling method, the first input signal IN1 and the second input signal IN2 may have opposing phases. The output signal OUT may have a high output value when the first switching device M1 is turned on in response to the first input signal IN1, and may have a low output value when the second switching device M2 is turned on in response to the second input signal IN2. Thus, a controller may determine a value of the output signal OUT based on the first input signal IN1 and the second input signal IN2.

For example, when a value of the output signal OUT changes from a high output value to a low output value or from a low output value to a high output value, a slew rate of the output signal OUT may be affected by magnitudes of the first input signal IN1 and the second input signal IN2, and/or parasitic components present in respective devices and nodes, or the like. As the capacity of data to be exchanged through the interface circuit 50 gradually increases, various methods in which a slew rate of the output signal OUT may be improved have been proposed.

On the other hand, when the interface circuit 50 operates according to the C-PHY interface, in which data is transmitted in a multi-level signaling method, the first input signal IN1 and the second input signal IN2 may not always have phases opposing each other. The first input signal IN1 and the second input signal IN2 may have the same value for at least a period of time, and the output signal OUT may have one of a high output value, a low output value and an intermediate output value that is between the high output value and the low output value.

In an example embodiment, the slew rate of the output signal OUT may be adjusted by charging or discharging the first capacitor C1 and the second capacitor C2. For example, when the output signal OUT increases, at least one of the first capacitor C1 and the second capacitor C2 may be charged, and when the output signal OUT decreases, at least one of the first capacitor C1 and the second capacitor C2 may be discharged, thereby increasing the slew rate of the output signal OUT.

Furthermore, when the interface circuit 50 is defined as a unit circuit, the output terminal 53 may be connected to a plurality of unit circuits. For example, the output terminal 53 may be connected to one or more first unit circuits and one or more second unit circuits. In some example embodiments, the capacitors C1 and C2 and the resistors $R_{UP}$ and $R_{DN}$ in the first unit circuit may be different the capacitors C1 and C2 and the resistors $R_{UP}$ and $R_{DN}$ in the second unit circuit.

In an example embodiment, a single output terminal 53 may be connected to five of the first unit circuits and two of the second unit circuits. For example, a sum of values of turn-on resistors of the first resistor $R_{UP}$ and the first switching device M1 in the first unit circuits, may be half of a sum of values of turn-on resistors of the first resistor $R_{UP}$ and the first switching device M1 in the second unit circuits. Similarly, a sum of values of turn-on resistors of the second resistor $R_{DN}$ and the second switching device M2 in the first unit circuits, may be half of a sum of values of turn-on resistors of the second resistor $R_{DN}$ and the second switching device M2 in the second unit circuits. In a real operation, an expected value of a turn-on resistor of a unit circuit may be determined by controlling the first switching device M1 and the second switching device M2 included in each of the first unit circuits and the second unit circuits.

In an example embodiment, a size of each of the first switching element M1 and the second switching element M2 may be determined based on a value of the turn-on resistor. For example, when a gate length of each of the first switching element M1 and the second switching element M2 in each of the first unit circuits and the second unit circuits, a gate width of the first switching element M1 in each of the first unit circuits may be twice of a gate width of the first switching element M1 in each of the second unit circuits. In above example, the gate width may be determined in a direction crossing the gate length. Similarly, a gate width of the second switching element M2 in the first unit circuits may be twice of a gate width of the second switching element M2 in the second unit circuits.

When the number of the first unit circuits is five and the number of the second unit circuits is two, a magnitude of the first capacitor C1 in the first unit circuits may be twice of a magnitude of the first capacitor C1 in the second unit circuits. Also, a magnitude of the second capacitor C2 in the first unit circuits may be twice of a magnitude of the second capacitor C2 in the second unit circuits.

For C_PHY interface operating in a multi-level signal, at least three output nodes may be used to transmit data. Also, each of the output nodes do not have a same value, and may have one of a high output value, a low output value and an intermediate output value. In an example embodiment, all of the first unit circuits and the second unit circuits connected to the output node outputting the high output value or the low output value may be operated. In contrast, only a portion of the first unit circuits may be operated, among the first unit circuits connected to the output node outputting the intermediate output value, and the second unit circuits connected to the output node outputting the intermediate output value may not be operated.

Figure 4:
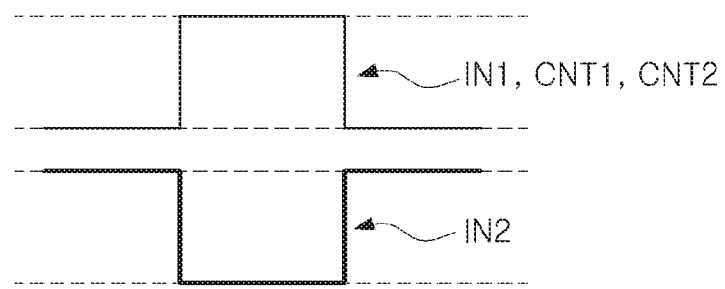
FIGS. 4 to 5B are drawings of waveforms in operations of an interface circuit according to an example embodiment.
Figure 5A:
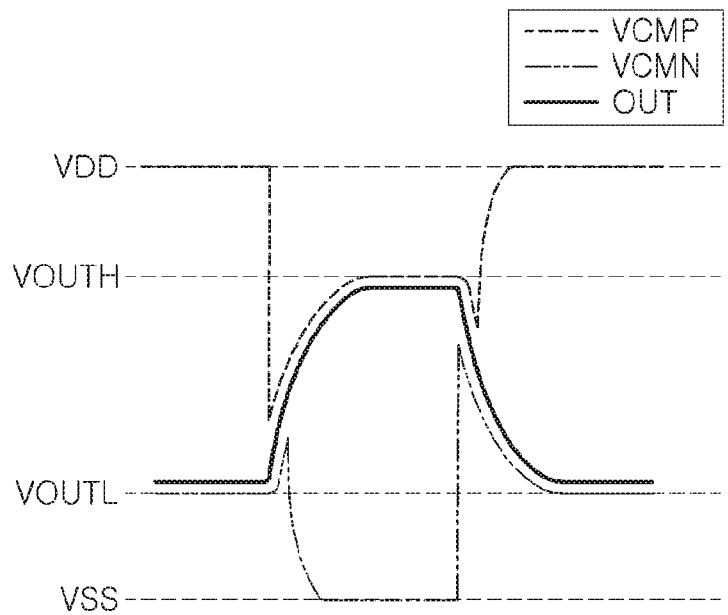
Figure 5B:
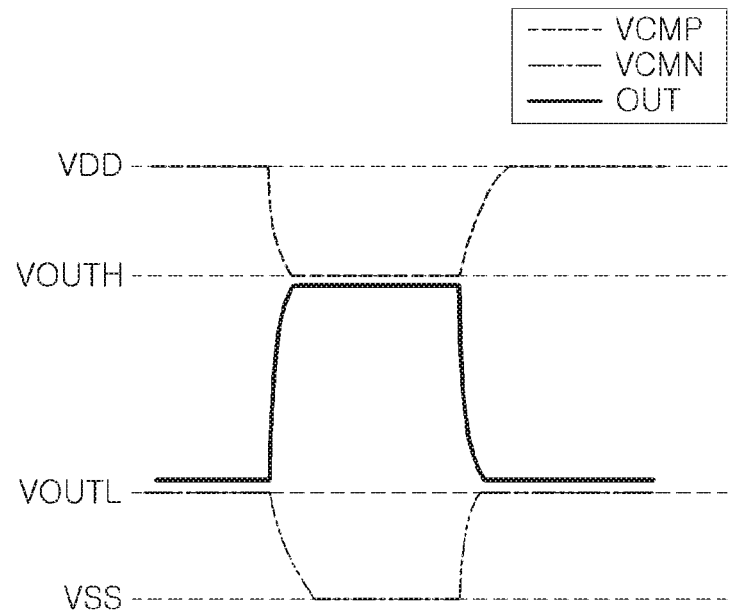

FIGS. 4 to 5B are drawings of waveforms in operations of an interface circuit according to an example embodiment.

Referring to FIG. 4, the first control signal CNT1 and the second control signal CNT2 may have the same phase as that of the first input signal IN1, while the second input signal IN2 may have a phase opposite to a phase of the first input signal IN1. As illustrated in the example embodiment of FIG. 4, since the phases of the first and second input signals IN1 and IN2 and the first and second control signals CNT1 and CNT2 are determined, a phase of the output signal OUT may be increased.

FIGS. 5A and 5B are waveform diagrams of output signals OUT of the interface circuit 50, and common voltages VCMP and VCMN detected at common nodes CMP and CMN thereof. FIG. 5A is a waveform diagram of the output signal OUT and the common voltages VCMP and VCMN, for example, in a case in which the first and second capacitors C1 and C2 are not provided. With reference to FIG. 5A, at a rising edge of the first input signal IN1 at which the first switching device M1 is turned on, a first common voltage VCMP of the first common node CMP may be greatly reduced from the first power supply voltage VDD. The output signal OUT may be proportional to a difference between the first power supply voltage VDD and the first common voltage VCMP, and thus, may be slowly increased at the rising edge of the first input signal IN1. For example, a rate at which the output signal OUT increases to a high output value VOUTH from a low output value VOUTL may be reduced.

Similarly, at a rising edge of the second input signal IN2 at which the second switching device M2 is turned on, a second common voltage VCMN of the second common node CMN may be greatly and rapidly increased from the second power supply voltage VSS. Thus, the output signal OUT may be slowly decreased at the rising edge of the second input signal IN2. For example, a rate at which the output signal OUT decreases from the high output value VOUTH to the low output value VOUTL may be reduced.

On the other hand, referring to the example embodiment of FIG. 5B in which the first and second capacitors C1 and C2 are provided, the first capacitor C1 may be charged by the first control signal CNT1 at the rising edge of the first input signal IN1 at which the first switching device M1 is turned on. Thus, the first common voltage VCMP may be slowly decreased by the first capacitor C1, and the output signal OUT may be more rapidly increased from the low output value VOUTL to the high output value VOUTH.

On the other hand, at the rising edge of the second input signal IN2 at which the second switching device M2 is turned on, the second capacitor C2 may be discharged by the second control signal CNT2. Thus, the second common voltage VCMN may be slowly increased by the second capacitor C2, and the output signal OUT may be more rapidly reduced from the high output value VOUTH to the low output value VOUTL. For example, in an example embodiment, as the first control signal CNT1 and the second control signal CNT2 are determined as signals having the same phase as that of the first input signal IN1, a slew rate of the output signal OUT may be increased.

According to an example embodiment, a slew rate of the output signal OUT may also be intentionally reduced by determining the first control signal CNT1 and the second control signal CNT2 to have phases that are opposite to the phases in the example embodiment described above with reference to FIGS. 4 to 5B. The first control signal CNT1 and the second control signal CNT2 may be generated to have the same phase as that of the second input signal IN2, to lower the slew rate of the output signal OUT. By intentionally reducing the slew rate of the interface circuit 50, in the case in which high-speed data communications is not used, an operation of the interface circuit 50 interfering with other components of an electronic device, for example, affecting performance of an RF module, a GPS module, or the like, may be significantly reduced, thereby improving electromagnetic interference characteristics.

Figure 6:
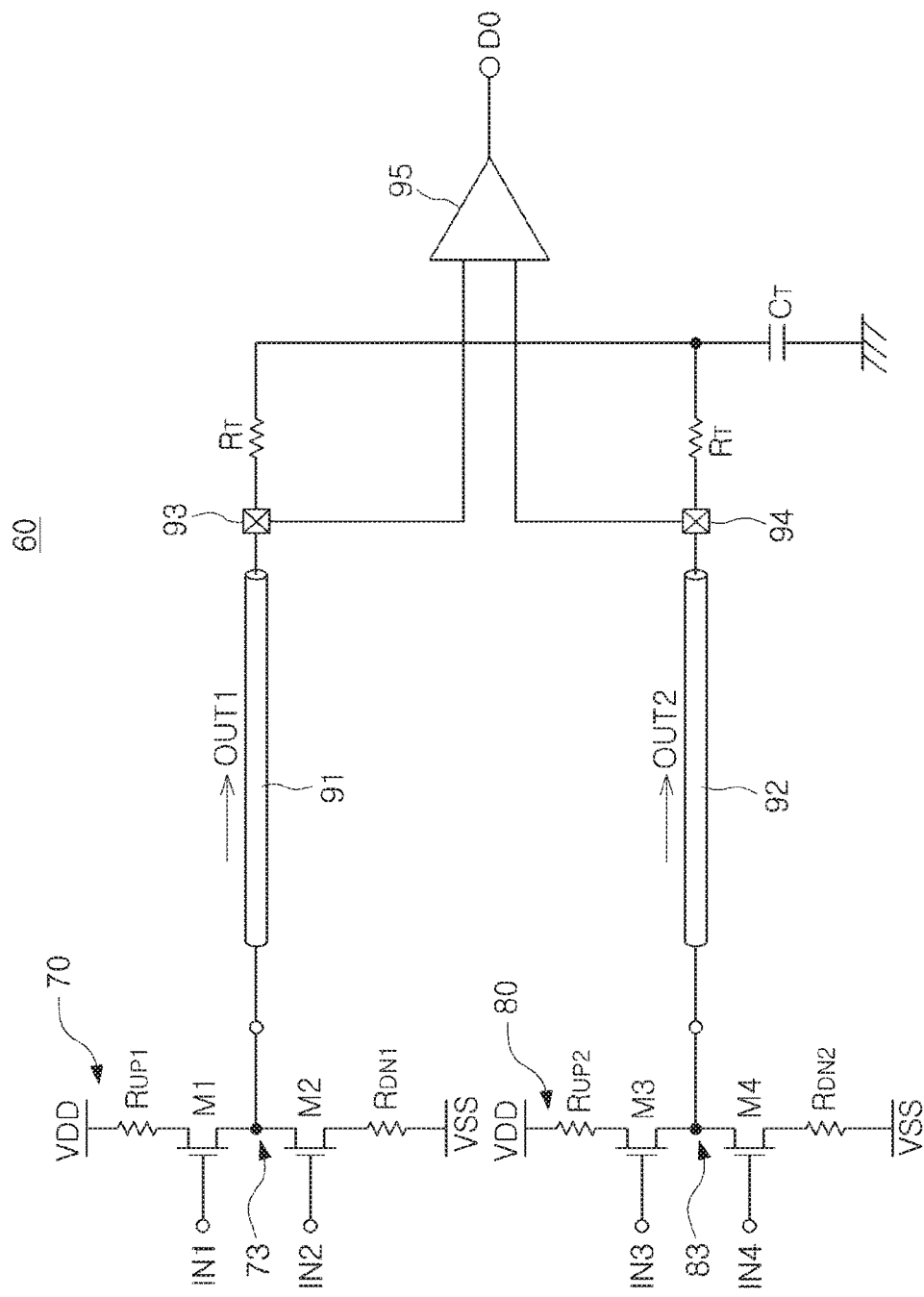
FIGS. 6 to 7B are diagrams of operations of an interface circuit according to a comparative example.
Figure 7A:
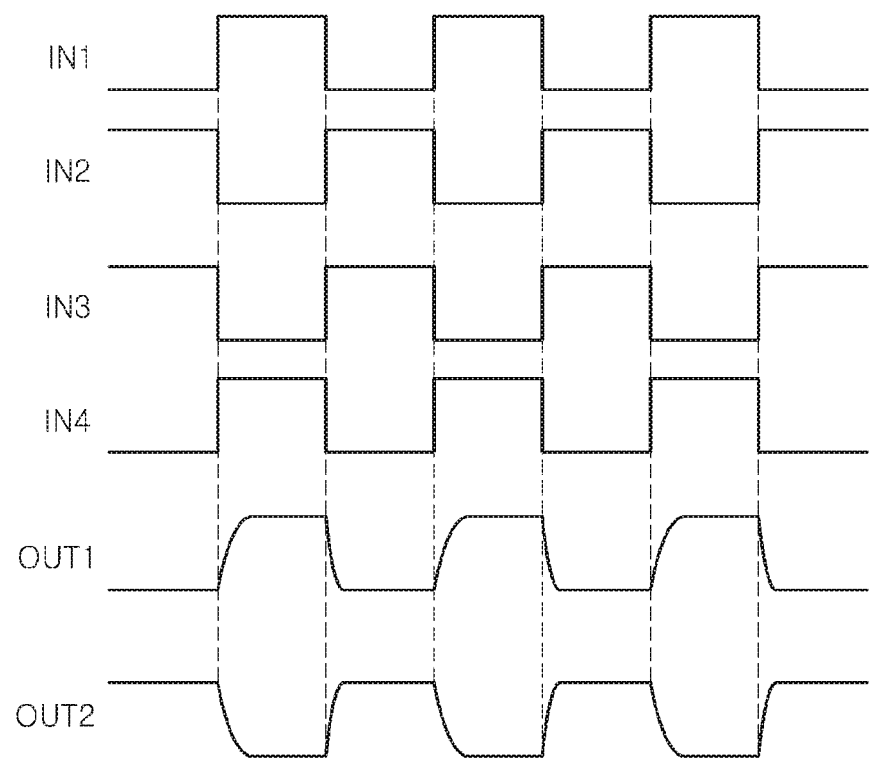
Figure 7B:

FIGS. 6 to 7B are diagrams of operations of an interface circuit according to a comparative example. For example, FIGS. 6 to 7B are comparative examples for illustrating operations of an interface circuit according to an example embodiment.

Referring to FIG. 6, an interface circuit 60 may include a first circuit 70 outputting a first output signal OUT1, and a second circuit 80 outputting a second output signal OUT2. The interface circuit 60 according to an example embodiment illustrated in FIG. 6 may support communications according to the D-PHY interface based on the MIPI standard. The first output signal OUT1 and the second output signal OUT2 may have phases opposite to each other.

The first output signal OUT1 may be input to a first receiving node 93 along a first transmission path 91, and the second output signal OUT2 may be input to a second receiving node 94 along a second transmission path 92. A terminating circuit may be connected to each of the first receiving node 93 and the second receiving node 94, and may include a terminating resistor $R_T$ for each of the first and second receiving nodes 93 and 94, and a terminating capacitor $C_T$. A receiver 95 may generate reception data D0 using the first output signal OUT1 and the second output signal OUT2.

The first circuit 70 and the second circuit 80 may have the same structure. Describing the first circuit 70 by way of example, the first circuit 70 may include a first switching device M1, a second switching device M2, a first resistor $R_{UP1}$, a second resistor $R_{DN1}$, and the like. Operations of the first switching device M1 and the second switching device M2 may be controlled by a first input signal IN1 and a second input signal IN2, respectively. The first output signal OUT1 may be output through an output node 73, and may increase when the first switching device M1 is turned on, and may decrease when the second switching device M2 is turned on.

FIGS. 7A and 7B are diagrams of waveforms in operations of the interface circuit 60 illustrated in FIG. 6. Referring to FIG. 7A, since the first output signal OUT1 and the second output signal OUT2 have opposing phases in communications, according to the D-PHY interface, the first input signal IN1 and a fourth input signal IN4 may have the same phase, while the second input signal IN2 and a third input signal IN3 may have the same phase but opposite to the phase of the first and fourth input signals IN1 and IN4. In the interface circuit 60 illustrated in FIG. 6, the first circuit 70 and the second circuit 80 may omit an element capable of adjusting a slew rate of the first output signal OUT1 and the second output signal OUT2. Thus, as illustrated in FIG. 7B, the slew rate of the first output signal OUT1 and the second output signal OUT2 may be relatively low, and an eye margin shown in the graph of the output signal in FIG. 7B may be decreased.

Figure 8:
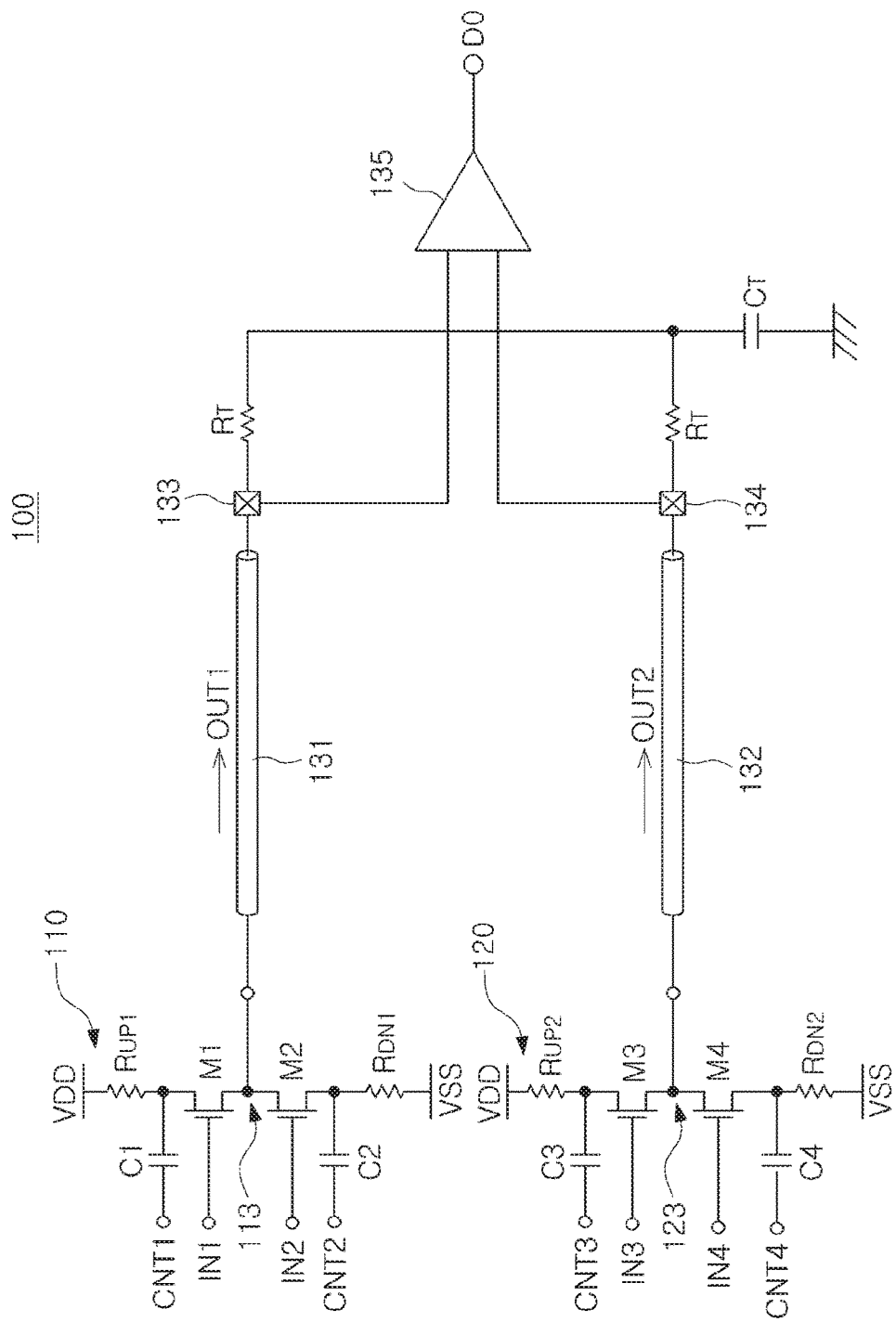
FIGS. 8 to 10B are diagrams of operations of an interface circuit according to an example embodiment.

FIGS. 8 to 10 are diagrams of operations of an interface circuit according to an example embodiment.

Referring to FIG. 8, an interface circuit 100 according to an example embodiment may include a first circuit 110 outputting a first output signal OUT1, a second circuit 120 outputting a second output signal OUT2. The interface circuit 100 according to the example embodiment illustrated in FIG. 8 may support communications according to the D-PHY interface based on the MIPI standard, and the first output signal OUT1 and the second output signal OUT2 may be of opposite phases. Configurations and operations of data transmission paths 131 and 132, a terminating circuit, a receiver 135, and the like may be similar to those described above with reference to FIG. 6.

The first circuit 110 and the second circuit 120 may have the same structure. Describing the first circuit 110 by way of example, the first circuit 110 may include a first switching device M1, a second switching device M2, a first resistor $R_{UP1}$, a second resistor $R_{DN1}$, and the like. Operations of the first switching device M1 and the second switching device M2 may be controlled by a first input signal IN1 and a second input signal IN2, respectively. The first output signal OUT1 may be output through an output node 113, and may increase when the first switching device M1 is turned on, and may decrease when the second switching device M2 is turned on.

The first circuit 110 may include a first capacitor C1 and a second capacitor C2. The first capacitor C1 may be connected to the first resistor $R_{UP1}$ and the first switching device M1, and may be charged or discharged by a first control signal CNT1. The second capacitor C2 may be connected to the second resistor $R_{DN1}$ and the second switching device M2, and may be charged or discharged by the second control signal CNT2. A controller controlling the interface circuit 100 may adjust a slew rate of the first output signal OUT1, using the first control signal CNT1 and the second control signal CNT2. Similarly, a slew rate of the second output signal OUT2 may be determined by a third control signal CNT3 and a fourth control signal CNT4, charging or discharging a third capacitor C3 and a fourth capacitor C4, respectively.

Figure 9A:
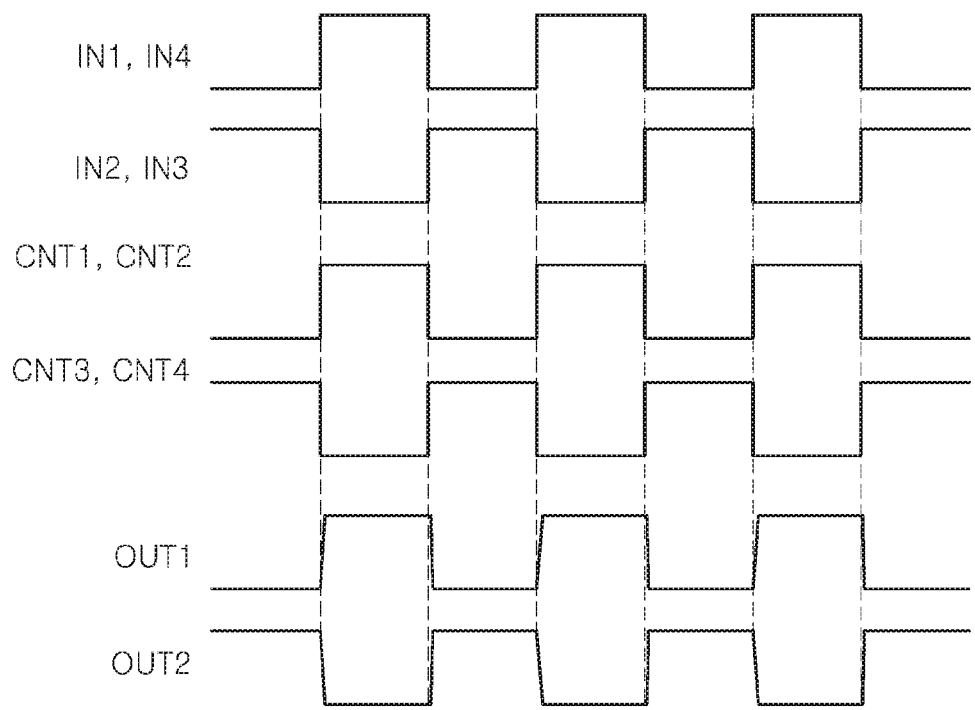
Figure 9B:
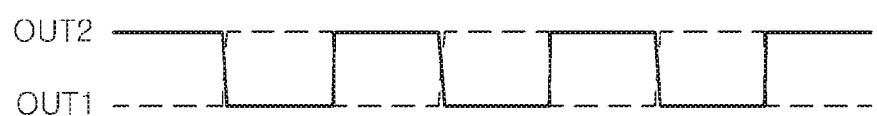

FIGS. 9A and 9B are waveform diagrams in an example embodiment in which the slew rate of the first output signal OUT1 and the second output signal OUT2 may be increased according to the circuit shown in FIG. 8. With reference to FIG. 9A, the first input signal IN1 and the second input signal IN2 may have opposite phases, and a third input signal IN3 and a fourth input signal IN4 may have opposite phases. The first input signal IN1 and the fourth input signal IN4 may have the same phase. Thus, the first output signal OUT1 and the second output signal OUT2 may have opposite phases.

The first control signal CNT1 and the second control signal CNT2 input to the first circuit 110 may have the same phase as that of the first input signal IN1. Thus, the first capacitor C1 may be charged at a rising edge of the first input signal IN1 at which the first switching device M1 is turned on, and the first output signal OUT1 may rapidly increase. The second capacitor C2 may be discharged at a rising edge of the second input signal IN2 at which the second switching device M2 is turned on, and the first output signal OUT1 may be rapidly reduced.

The third control signal CNT3 and the fourth control signal CNT4 input to the second circuit 120 may have the same phase as that of the third input signal IN3. Thus, similarly to the case described with reference to the first circuit 110, for example, when the third switching device M3 is turned on, the second output signal OUT2 may rapidly increase, and when the fourth switching device M4 is turned on, the second output signal OUT2 may be rapidly reduced. By increasing the slew rate as described above, an eye margin may be increased as illustrated in FIG. 9B. In addition, since a period of time for which reception data D0 generated by the receiver 135 has a high logic value or a low logic value increases, a receiving side may more precisely detect the reception data D0.

Figure 10A:
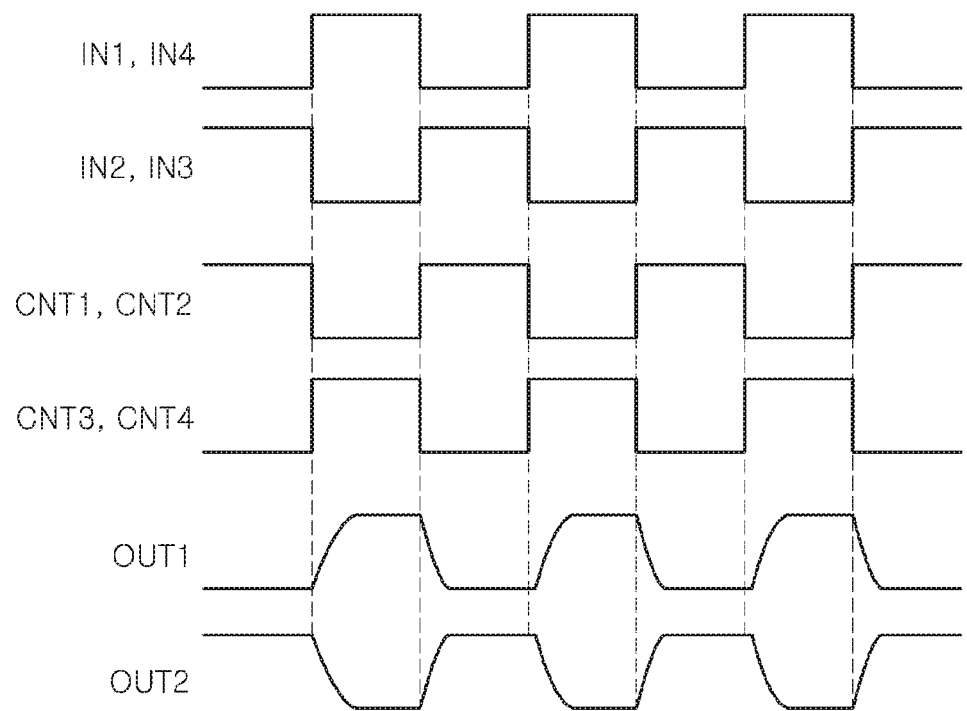
Figure 10B:

FIGS. 10A and 10B are waveform diagrams in an example embodiment in which the slew rate of the first output signal OUT1 and the second output signal OUT2 may be reduced. With reference to FIG. 10A, the first input signal IN1 and the second input signal IN2 may have opposite phases, and the third input signal IN3 and the fourth input signal IN4 may have opposite phases. The first input signal IN1 and the fourth input signal IN4 may have the same phase. Thus, the first output signal OUT1 and the second output signal OUT2 may have opposite phases.

The first control signal CNT1 and the second control signal CNT2 input to the first circuit 110 may have the same phase as that of the second input signal IN2. The first capacitor C1 may be discharged at a rising edge of the first input signal IN1 at which the first switching device M1 is turned on, and a voltage of a common node between the first resistor $R_{UP1}$ and the first switching device M1 may be rapidly reduced. Thus, the first output signal OUT1 may slowly increase. In addition, the second capacitor C2 may be charged at a rising edge of the second input signal IN2 at which the second switching device M2 is turned on, and the first output signal OUT1 may slowly decrease.

The third control signal CNT3 and the fourth control signal CNT4 input to the second circuit 120 may have the same phase as that of the fourth input signal IN4. Thus, for example, when the third switching device M3 is turned on, the second output signal OUT2 may slowly increase, and when the fourth switching device M4 is turned on, the second output signal OUT2 may slowly decrease. Thus, an eye margin may be reduced as illustrated in FIG. 10B.

As a result, the interface circuit 100 according to an example embodiment may also intentionally decrease the slew rate of the output signals OUT1 and OUT2. By intentionally reducing the slew rate as described above with respect to FIGS. 9-10B, in the case of communications that are not high-speed data communications, interference affecting performance of other components of an electronic device, such as an RF module, a GPS module, or the like, may be significantly reduced in communications using the interface circuit 100.

FIGS. 11 to 16 are flow drawings of operations of a memory device according to an example embodiment.

Figure 11:
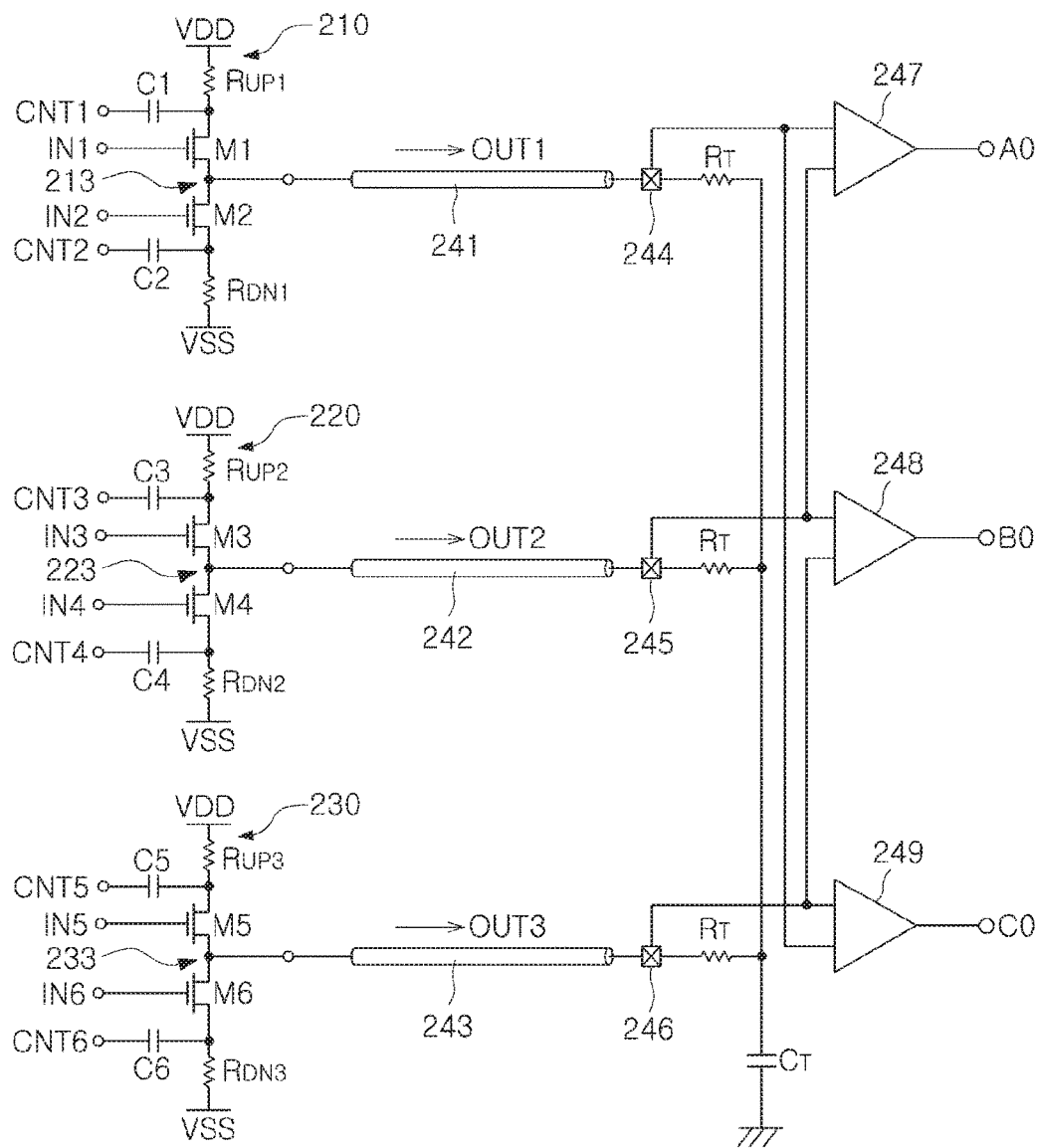
FIGS. 11 to 16 are flow drawings of operations of a memory device according to an example embodiment.

Referring to FIG. 11, an interface circuit 200 according to an example embodiment may include a first circuit 210 outputting a first output signal OUT1, a second circuit 220 outputting a second output signal OUT2, and a third circuit 230 outputting a third output signal OUT3. The interface circuit 200 according to the example embodiment illustrated in FIG. 11 may support communications according to the C-PHY interface based on the MIPI standard. The first to third output signals OUT1 to OUT3 may have any one of a high output value, an intermediate output value and a low output value, and the first to third output signals OUT1 to OUT3 may thus not have the same value.

The first output signal OUT1 may be input to a first receiving node 244 along a first transmission path 241, the second output signal OUT2 may be input to a second receiving node 245 along a second transmission path 242, and the third output signal OUT3 may be input to a third receiving node 246 along a third transmission path 243. A terminating circuit may be connected to each of the first receiving node 244, the second receiving node 245 and the third receiving node 246, and the terminating circuit may include a terminating resistor $R_T$ for each of the first through third receiving nodes 244, 245, and 246, and a terminating capacitor $C_T$.

First to third receivers 247 to 249 may generate first to third reception data A0 to C0, using the first to third output signals OUT1 to OUT3. The first receiver 247 may generate the first reception data A0, using a difference between the first output signal OUT1 and the second output signal OUT2, and the second receiver 248 may generate the second reception data B0, using a difference between the second output signal OUT2 and the third output signal OUT3. The third receiver 249 may generate the third reception data C0 using a difference between the third output signal OUT3 and the first output signal OUT1. In an example embodiment, the first to third reception data A0 to C0 may be converted into state information having three bits by a receiving side, and symbol information may be generated using a change in the state information in the receiving side.

The first circuit 210, the second circuit 220, and the third circuit 230 may have the same structure. Describing the first circuit 210 by way of example, the first circuit 210 may include a first switching device M1, a second switching device M2, a first resistor $R_{UP1}$, a second resistor $R_{DN1}$, and the like. In an example embodiment, the first resistor $R_{UP1}$ and the second resistor $R_{DN1}$ may have the same value. Operations of the first switching device M1 and the second switching device M2 may be controlled by a first input signal IN1 and a second input signal IN2, respectively. A magnitude of the first output signal OUT1 may be determined depending on on/off states of the first switching device M1 and the second switching device M2.

In the example embodiment illustrated in FIG. 11, the first circuit 210 may include a first capacitor C1 and a second capacitor C2. The first capacitor C1 may be connected to the first resistor $R_{UP1}$ and the first switching device M1, and may be charged or discharged by a first control signal CNT1. The second capacitor C2 may be connected to the second resistor $R_{DN1}$ and the second switching device M2, and may be charged or discharged by the second control signal CNT2.

A controller controlling the interface circuit 200 may adjust a slew rate of the first output signal OUT1, using the first control signal CNT1 and the second control signal CNT2. Similarly, a slew rate of the second output signal OUT2 may be determined by a third control signal CNT3 and a fourth control signal CNT4, charging or discharging a third capacitor C3 and a fourth capacitor C4, respectively. In addition, a slew rate of the third output signal OUT3 may be determined by a fifth control signal CNT5 and a sixth control signal CNT6, charging or discharging a fifth capacitor C5 and a sixth capacitor C6, respectively.

Figure 12:
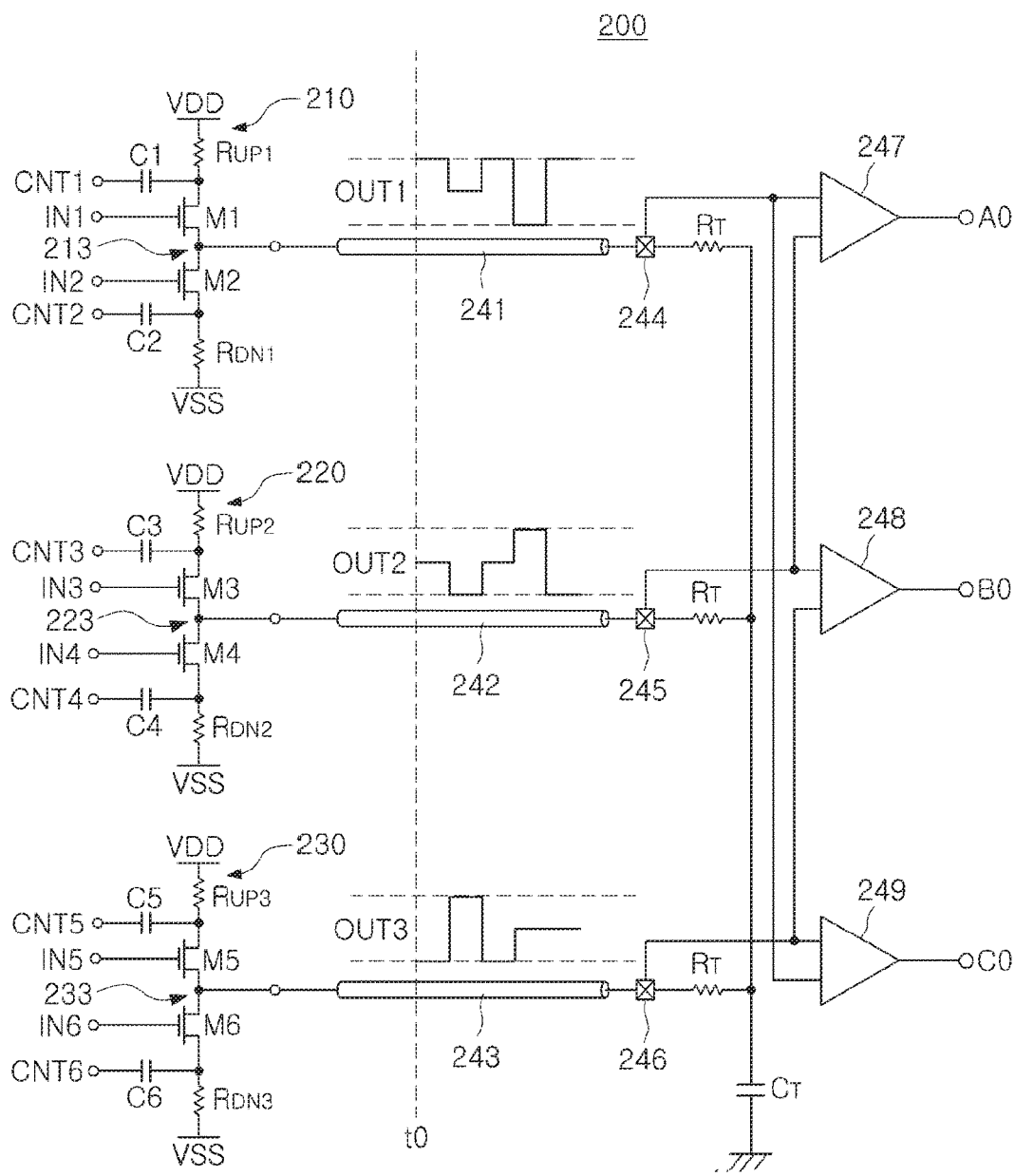

Referring to FIG. 12, waveform diagrams of the first output signal OUT1, the second output signal OUT2, and the third output signal OUT3 according to an example embodiment are illustrated together with the interface circuit 200. With reference to FIG. 12, the first output signal OUT1, the second output signal OUT2 and the third output signal OUT3 may respectively have one of a high output value, an intermediate output value, and a low output value, and may not have the same output value.

For example, at time t0, when the first output signal OUT1 has a high output value, the second output signal OUT2 has an intermediate output value, and the third output signal OUT3 has a low output value; the first switching device M1 of the first circuit 210 may be turned on, and the second switching device M2 thereof may be turned off. In addition, a third switching device M3 and the fourth switching device M4 of the second circuit 220 may both be turned on. In the case of the third circuit 230, a fifth switching device M5 may be turned off, and a sixth switching device M6 may be turned on. For example, when the first output signal OUT1 has a high output value, the second output signal OUT2 has an intermediate output value and the third output signal OUT3 has a low output value; the first resistor $R_{UP1}$ and the second resistor $R_{DN1}$ of the first circuit 210 and the first resistor $R_{UP3}$ and the second resistor $R_{DN3}$ of the third circuit 230 may have the same value. On the other hand, a first resistor $R_{UP2}$ and a second resistor $R_{DN2}$ of the second circuit 220 may have the same value, and may have a value different from those of resistors $R_{UP1}$, $R_{UP3}$, $R_{DN1}$ and $R_{DN3}$ included in the first circuit 210 and the third circuit 230.

A current flowing through the first switching device M1 may flow to the sixth switching device M6 through the first and third data transmission paths 241 and 243. In an example embodiment, a voltage of the first receiving node 244 may be 3*VDD/4, and a voltage of the third receiving node 246 may be VDD/4. On the other hand, in the second circuit 220, since the third switching device M3 and the fourth switching device M4 are both turned on, a current may flow in the second circuit 220. Thus, a voltage of the second receiving node 245 may be VDD/2. Thus, each of the first receiver 247 and the second receiver 248 may determine the first reception data A0 and the second reception data B0 to have a high logic value, for example, '1', while the third receiver 249 may determine the third reception data C0 to have a low logic value, for example, '0.'

In an example embodiment illustrated in FIG. 12, a method of controlling the first and second capacitors C1 and C2 to increase a slew rate of the first output signal OUT1 may be based on a change in the first output signal OUT1. For example, when the first output signal OUT1 decreases from a high output value to an intermediate output value, the second capacitor C2 may be discharged to increase the slew rate. In addition, when the first output signal OUT1 increases from a low output value to a high output value, the first capacitor C1 and the second capacitor C2 may be charged to increase the slew rate. Hereinafter, a method of adjusting respective slew rates of the first to third output signals OUT1 to OUT3 illustrated in FIG. 12 will be described with reference to FIGS. 13 to 15.

Figure 13A:
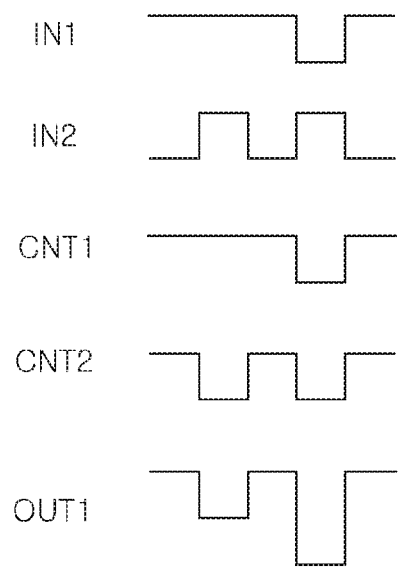
Figure 13B:
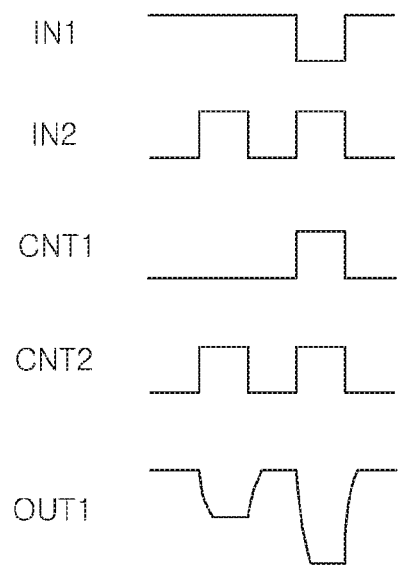

FIGS. 13A and 13B are waveform diagrams in a method of adjusting a slew rate of the first output signal OUT1. First, FIG. 13A may correspond to a case of increasing the slew rate of the first output signal OUT1. Referring to FIG. 13A, for example, when the first input signal IN1 and the second input signal IN2 both have a high input value, the first output signal OUT1 may have an intermediate output value. In addition, when only the first input signal IN1 has a high input value, the first output signal OUT1 may have a high output value, and when only the second input signal IN2 has a high input value, the first output signal OUT1 may have a lower output value.

Referring to FIG. 13A, for example, when the first output signal OUT1 decreases from the high output value to the intermediate output value, the second capacitor C2 may be discharged to rapidly decrease the first output signal OUT1. When the first output signal OUT1 is reduced from a high output value to a low output value, the first and second capacitors C1 and C2 may be discharged, and when the first output signal OUT1 increases from a low output value to a high output value, the first and second capacitors C1 and C2 may be charged to increase the slew rate of the first output signal OUT1. In an example embodiment, for example, when the first output signal OUT1 increases from an intermediate output value to a high output value, the first and second capacitors C1 and C2 may not be charged or discharged.

Referring to FIG. 13B, the slew rate of the first output signal OUT1 may also be reduced by charging or discharging the first and second capacitors C1 and C2 in a manner different from the example embodiment of FIG. 13A. Referring to FIG. 13B, for example, when the first output signal OUT1 decreases from a high output value to an intermediate output value, the second capacitor C2 may be charged to slowly reduce the first output signal OUT1. When the first output signal OUT1 decreases from a high output value to a low output value, the first and second capacitors C1 and C2 may be charged. When the first output signal OUT1 increases from a low output value to a high output value, the first and second capacitors C1 and C2 may be discharged to reduce the slew rate of the first output signal OUT1.

Figure 14A:
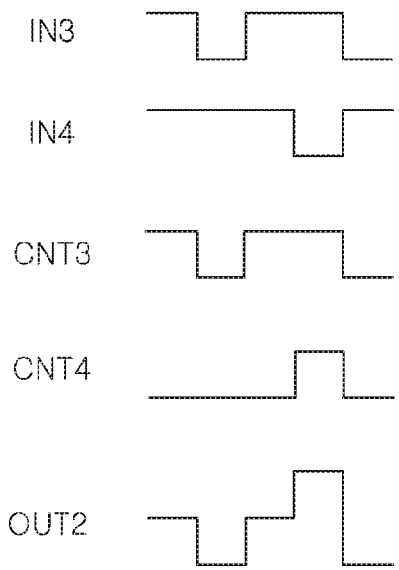
Figure 14B:
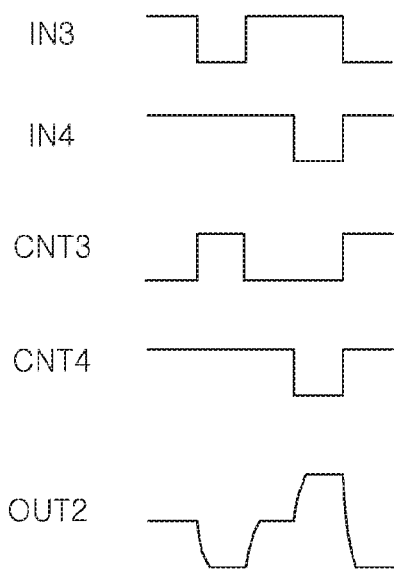

FIGS. 14A and 14B are waveform diagrams provided to illustrate a method of adjusting a slew rate of the second output signal OUT2. FIG. 14A illustrates an example embodiment in which a slew rate of the second output signal OUT2 increases. Referring to FIG. 14A, for example, when the second output signal OUT2 increases from a low output value to an intermediate output value, the third capacitor C3 may be charged to rapidly increase the second output signal OUT2. In addition, when the second output signal OUT2 decreases from a high output value to a low output value, the third and fourth capacitors C3 and C4 may be discharged to increase the slew rate of the second output signal OUT2. In an example embodiment, when the second output signal OUT2 decreases from an intermediate output value to a low output value, the third and fourth capacitors C3 and C4 may not be charged or discharged.

On the other hand, FIG. 14B illustrates an example embodiment in which the slew rate of the second output signal OUT2 may be reduced by charging or discharging the third and fourth capacitors C3 and C4, as opposed to the example embodiment of FIG. 14A. Referring to FIG. 14B, when the second output signal OUT2 increases from a low output value to an intermediate output value, the third capacitor C3 may be discharged to slowly increase the second output signal OUT. In addition, when the second output signal OUT2 decreases from a high output value to a low output value, the third and fourth capacitors C3 and C4 may be charged to reduce the slew rate of the second output signal OUT2.

Figure 15A:
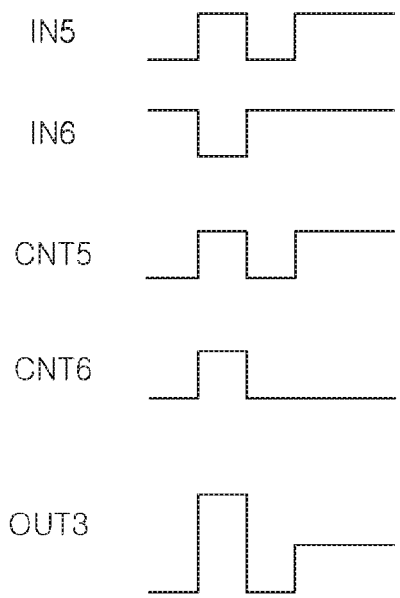
Figure 15B:
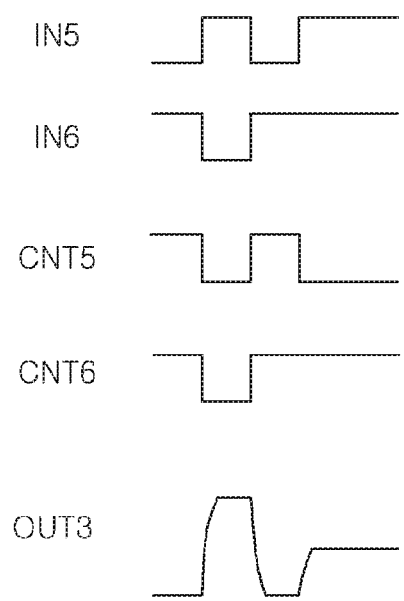

FIGS. 15A and 15B are waveform diagrams provided to illustrate a method of adjusting a slew rate of the third output signal OUT3. FIG. 15A illustrates an example embodiment in which a slew rate of the third output signal OUT3 increases, and may be similar to the example embodiment described above with reference to FIGS. 13A and 14A. For example, when the third output signal OUT3 increases from a low output value to a high output value, the fifth and sixth capacitors C5 and C6 may be charged to rapidly increase the third output signal OUT3. In addition, when the third output signal OUT3 decreases from a high output value to a low output value, the fifth and sixth capacitors C5 and C6 may be discharged to increase the slew rate of the third output signal OUT3.

Referring to FIG. 15B illustrating an example embodiment in which a slew rate of the third output signal OUT3 decreases, for example, when the third output signal OUT3 decreases from a high output value to a low output value, the fifth and sixth capacitors C5 and C6 may be charged to gradually reduce the third output signal OUT3. In addition, when the third output signal OUT3 increases from a low output value to an intermediate output value, the fifth capacitor C5 may be discharged to reduce the slew rate of the third output signal OUT3.

In detail, in an example embodiment, the capacitors C1 to C6 included in the first to third circuits 210 to 230 of the interface circuit 200 may be appropriately charged or discharged, thereby increasing or decreasing slew rates of the output signals OUT1 to OUT3. For example, the capacitors C1, C3 and C5 and the switching devices M1, M3 and M5 connected to a first power supply voltage VDD may be defined as pull-up capacitors and pull-up switching devices, respectively. The capacitors C2, C4 and C6 and the switching devices M2, M4 and M6 connected to a second power supply voltage VSS may be defined as pull-down capacitors and pull-down switching devices, respectively. In this case, a method of controlling a capacitor to increase a slew rate when an output signal is increased or decreased may be as illustrated in Table 1 below.

TABLE 1

| Output Signal | Pull-up Switching device | Pull-down Switching device | Pull-up Capacitor | Pull-down Capacitor |
|---|---|---|---|---|
| LOW->INTERMEDIATE | OFF->ON | ON->ON | Charge | No Control |
| INTERMEDIATE->HIGH | ON->ON | ON->OFF | No Control | Charge |
| LOW->HIGH | OFF->ON | ON->OFF | Charge | Charge |
| INTERMEDIATE->LOW | ON->OFF | ON->ON | Charge | No Control |
| HIGH->INTERMEDIATE | ON->ON | OFF->ON | No Control | Electric Discharge |
| HIGH->LOW | ON->OFF | OFF->ON | Electric Discharge | Electric Discharge |

Figure 16:
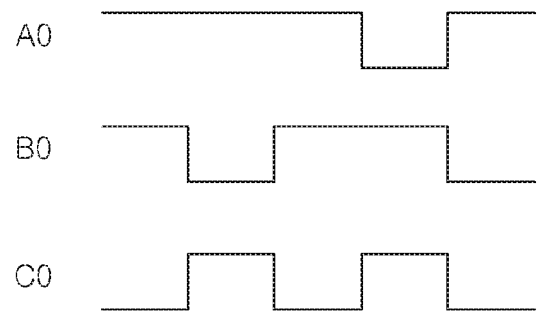

FIG. 16 illustrates waveform diagrams of first to third reception data A0 to C0 generated by the first to third output signals OUT1 to OUT3 according to the example embodiment illustrated in FIG. 12. For example, when the interface circuit 200 operates according to the C-PHY interface, the first to third reception data A0 to C0 may be combined to generate status information, and symbol information based on a change in the status information may be generated to restore data. By increasing the slew rate of the first to third output signals OUT1 to OUT3 by applying the method according to an example embodiment, an eye margin of the first to third reception data A0 to C0 may be improved, and high-speed data communications may be implemented more accurately.

Figure 17:
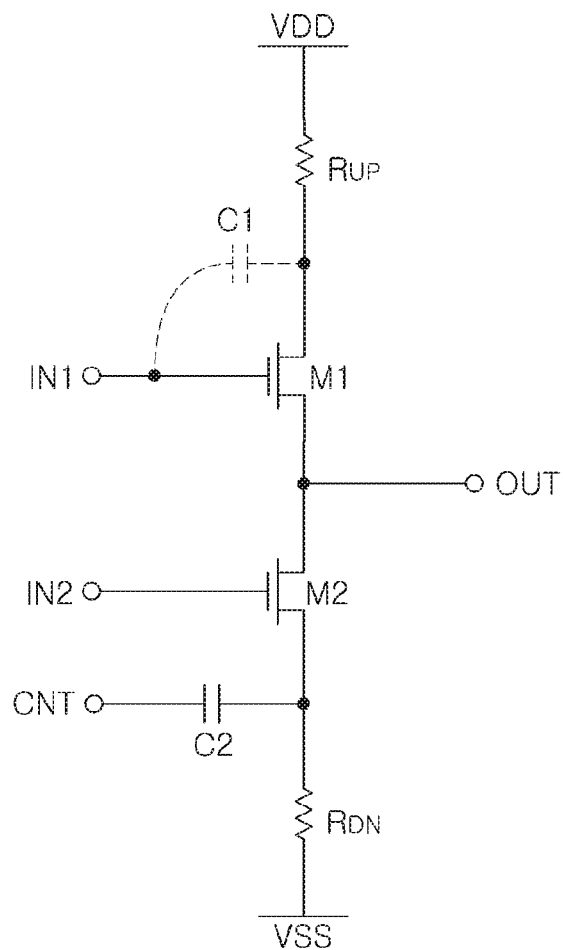
FIG. 17 is a schematic circuit diagram of an interface circuit according to an example embodiment.

FIG. 17 is a schematic circuit diagram of an interface circuit according to an example embodiment.

Referring to FIG. 17, an interface circuit 300 according to an example embodiment may include a first switching device M1, a second switching device M2, a first capacitor C1, a second capacitor C2, and the like. Operations of the interface circuit 300 may be similar to those in the foregoing example embodiments. For example, the first switching device M1 and the second switching device M2 may be controlled by a first input signal IN1 and a second input signal IN2, respectively, and the first input signal IN1 and the second input signal IN2 may have opposing phases. An output signal OUT may have the same phase as that of the first input signal IN1. In an example embodiment, a slew rate of the output signal OUT may be increased by controlling charge and discharge the first and second capacitors C1 and C2.

In the example embodiment of FIG. 17, the first capacitor C1 connected to a first common node CMP between the first switching device M1 and a first resistor $R_{UP}$ may be provided by parasitic capacitance of the first switching device M1. Thus, the first capacitor C1 may be charged or discharged by the first input signal IN1. The second capacitor C2 may be provided as a separate capacitor, and may be charged or discharged by a control signal CNT. Hereinafter, operations of the interface circuit 300 according to the example embodiment illustrated in FIG. 17 will be described with reference to FIG. 18.

Figure 18:
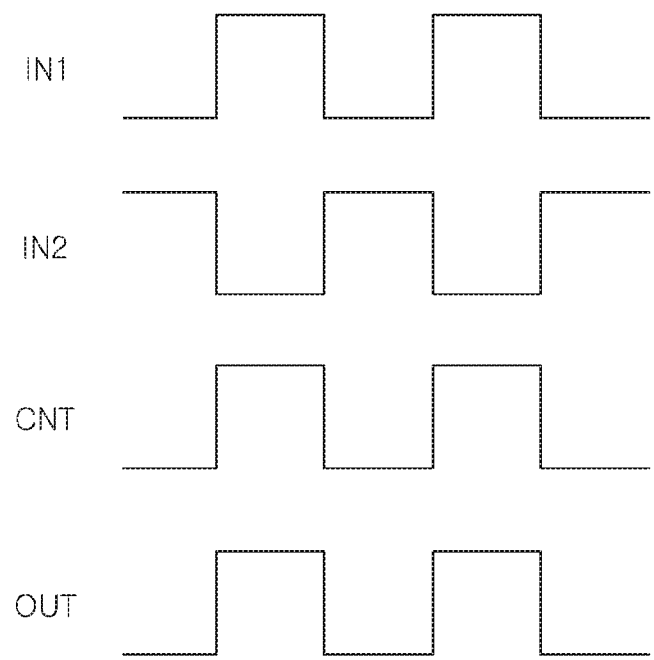
FIG. 18 provides diagrams of waveforms in operations of an interface circuit of FIG. 17, according to an example embodiment.

FIG. 18 is a waveform diagram provided to illustrate an operation of an interface circuit of FIG. 17, according to an example embodiment.

Referring to FIG. 18, the first input signal IN1 and the second input signal IN2 may have opposite phases, and the output signal OUT may have the same phase as that of the first input signal IN1. For example, when the first switching device M1 is turned on and the second switching device M2 is turned off at a rising edge of the first input signal IN1 and a falling edge of the second input signal IN2, respectively, the output signal OUT may be increased from a low output value to a high output value. On the other hand, when the first switching device M1 is turned off and the second switching device M2 is turned on at a falling edge of the first input signal IN1 and a rising edge of the second input signal IN2, respectively, the output signal OUT may be reduced from a high output value to a low output value.

As the first capacitor C1 is provided by a parasitic capacitor of the first switching device M1, the first capacitor C1 may be charged or discharged by the first input signal IN1. The first capacitor C1 may be charged by the first input signal IN1 at the rising edge of the first input signal IN1, and the second capacitor C2 may be charged by the control signal CNT. Thus, fluctuation ranges of voltages of common nodes CMP and CMN, in detail, a range of reduction in a voltage of a first common node CMP, may be reduced, and the output signal OUT may be rapidly increased to a high output value.

On the other hand, the first capacitor C1 may be discharged by the first input signal IN1 at the rising edge of the second input signal IN2, and the second capacitor C2 may be discharged by the control signal CNT. Thus, a variation range of voltages of the common nodes CMP and CMN and an increase range of a voltage of the second common node CMN may be reduced, and the output signal OUT may be rapidly reduced to a low output value. Furthermore, when the slew rate is to be further increased, a separate capacitor may be further connected in parallel with the first capacitor C1.

As set forth above, according to an example embodiment, a capacitor may be respectively connected to a first switching device and a second switching device of an interface circuit, and the capacitor may be charged or discharged depending on on/off operations of the first switching device and the second switching device. Thus, an interface circuit in which a slew rate of an output signal may be adjusted may be implemented with a relatively small area.

While example embodiments have been shown and described above, it will be apparent to those skilled in the art that modifications and variations could be made without departing from the scope of the present inventive concept as defined by the appended claims.

What is claimed is:

1. An interface circuit comprising:
    a first switching device connected to a first power supply node supplying a first power supply voltage, and controlled by a first input signal;
    a second switching device connected to a second power supply node supplying a second power supply voltage that is lower than the first power supply voltage, and controlled by a second input signal different from the first input signal;
    an output node defined by a node through which the first switching device and the second switching device are connected to each other in series, and outputting an output signal;
    a first resistor connected between the first power supply node and the first switching device;
    a second resistor connected between the second power supply node and the second switching device;
    a first capacitor connected to a node between the first resistor and the first switching device; and
    a second capacitor connected to a node between the second resistor and the second switching device.

2. The interface circuit of claim 1, wherein:
    the first capacitor is charged and discharged by a first control signal,
    the second capacitor is charged and discharged by a second control signal, and
    a first phase of the first control signal, a second phase of the second control signal, a third phase of the first input signal, and a fourth phase of the second input signal are adjusted to change a slew rate of the output signal.

3. The interface circuit of claim 2, wherein the slew rate of the output signal is increased in response to the first phase being the same as the third phase, and the second phase being opposite to the fourth phase.

4. The interface circuit of claim 2, wherein the slew rate of the output signal is reduced in response to the first phase being opposite to the third phase, and the second phase being the same as the fourth phase.

5. The interface circuit of claim 2, wherein the first capacitor is connected between a first common node connected to the first resistor and the first switching device, and a first control node receiving the first control signal.

6. The interface circuit of claim 1, wherein the first capacitor is provided by a parasitic capacitor present in the first switching device.

7. The interface circuit of claim 6, wherein the first capacitor is charged and discharged by the first input signal.

8. The interface circuit of claim 7, wherein the first resistor and the second resistor have the same value.

9. The interface circuit of claim 1, wherein the first input signal and the second input signal have the same value for at least a period of time.

10. The interface circuit of claim 9, wherein the output signal has one value among three output values, each having a different magnitude from the remaining ones of the three output values.

11. The interface circuit of claim 1, wherein the first input signal has a first input signal phase and the second input signal has a second input signal phase, and the first input signal phase is opposite to the second input signal phase.

12. The interface circuit of claim 11, wherein the output signal has a output signal phase that is the same as the first input signal phase.

13. An interface device comprising:
    a plurality of interface circuits, each including a first switching device and a second switching device connected in series, a first capacitor connected to a first terminal of the first switching device, and a second capacitor connected to a second terminal of the second switching device; and
    a controller controlling on/off operations of the first switching device and the second switching device of each of the plurality of interface circuits to determine an output signal of each of the plurality of interface circuits, and controlling charging and discharging the first capacitor and the second capacitor of each of the plurality of interface circuits to adjust a slew rate of the output signal of each of the plurality of interface circuits,
    wherein the output signal of each of the plurality of interface circuits has one of a first output value, a second output value greater than the first output value, and a third output value greater than the second output value.

14. The interface device of claim 13, wherein the controller inputs a charge signal to the first capacitor when the first switching device is turned on, and inputs a discharge signal to the second capacitor when the second switching device is turned on, to increase the slew rate of the output signal.

15. The interface device of claim 13, wherein the controller inputs a discharge signal to the first capacitor when the first switching device is turned on, and inputs a charge signal to the second capacitor when the second switching device is turned on, to reduce the slew rate of the output signal.

16. The interface device of claim 13, wherein the controller inputs a charge signal to the first capacitor, when the output signal increases from the first output value to either the second output value or the third output value.

17. The interface device of claim 13, wherein the controller inputs a discharge signal to the second capacitor, when the output signal decreases from the third output value to either the first output value or the second output value.

18. The interface device of claim 13, wherein each of the plurality of interface circuits comprises a first resistor connected to the first terminal of the first switching device, and a second resistor connected to the second terminal of the second switching device.

\* \* \* \* \*